United States Patent [19]
Pai et al.

[11] Patent Number: 5,317,479
[45] Date of Patent: May 31, 1994

[54] PLATED COMPLIANT LEAD

[75] Inventors: Deepak K. Pai, Burnsville; Terrance A. Krinke, Roseville, both of Minn.

[73] Assignee: Computing Devices International, Inc., Minneapolis, Minn.

[21] Appl. No.: 130,532

[22] Filed: Oct. 1, 1993

Related U.S. Application Data

[63] Continuation of Ser. No. 767,500, Sep. 30, 1991.

[51] Int. Cl.⁵ .............................................. H01R 9/00
[52] U.S. Cl. ........................................ 361/773; 361/764;
  361/776; 361/783; 361/813; 174/260; 257/692
[58] Field of Search ............... 361/764, 773, 776, 783,
  361/813; 174/52.1, 255, 257, 261; 257/690, 666,
  669, 692, 696; 439/17 C, 71, 275

[56] References Cited
U.S. PATENT DOCUMENTS

| | | | |
|---|---|---|---|
| 2,438,075 | 3/1948 | Smith | 173/361 |
| 3,864,014 | 2/1975 | Lynch | 339/275 R |
| 4,592,617 | 6/1986 | Seidler | 339/275 B |
| 4,673,967 | 6/1987 | Hingorany | 357/70 |
| 4,677,458 | 6/1987 | Morris | 357/74 |
| 4,705,205 | 11/1987 | Allen et al. | 228/180.2 |
| 4,755,146 | 7/1988 | Rishworth et al. | 439/71 |
| 4,788,767 | 12/1988 | Desai et al. | 29/830 |
| 4,827,611 | 5/1989 | Pai et al. | 29/843 |

*Primary Examiner*—Leo P. Picard
*Assistant Examiner*—Young Whang
*Attorney, Agent, or Firm*—Linney & Lange

[57] ABSTRACT

A curved lead provides a mechanical and electrical connection between a board contact on a circuit board and a chip contact associated with a circuit chip. The chip can be mounted to the circuit board, to a chip carrier or to a multiple-chip module. The curved lead is substantially entirely plated with solder and is formed of a single piece of conductive material. The curved lead has a first surface for connection to the chip contact and a second surface, generally parallel to the first surface, for connection to the board contact. The first and second surfaces are connected by at least one curved portion and are arranged to mount the circuit chip to the circuit board with the solder in a compliant, generally parallel arrangement substantially free of stress.

21 Claims, 3 Drawing Sheets

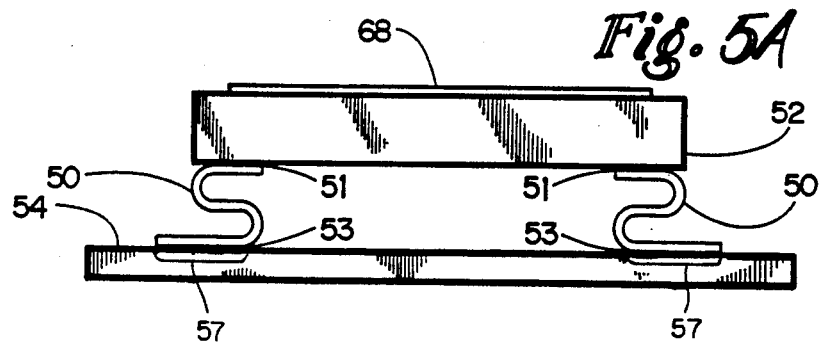
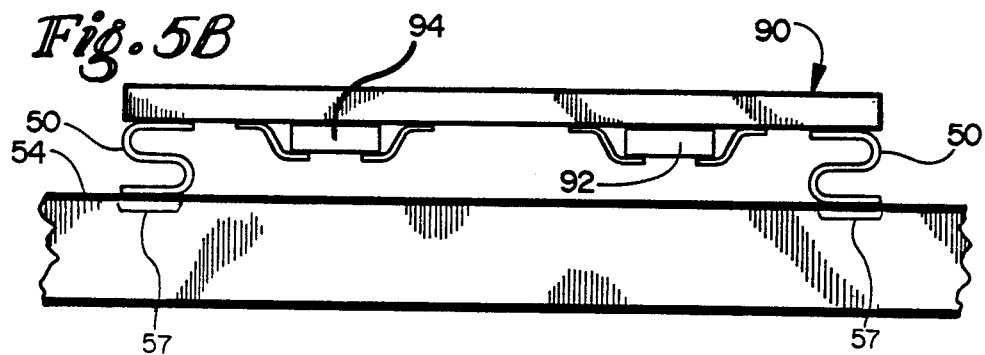
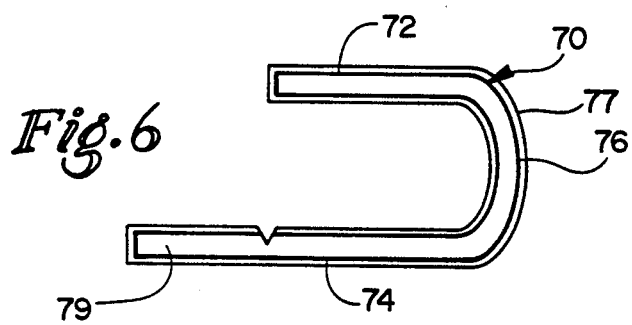
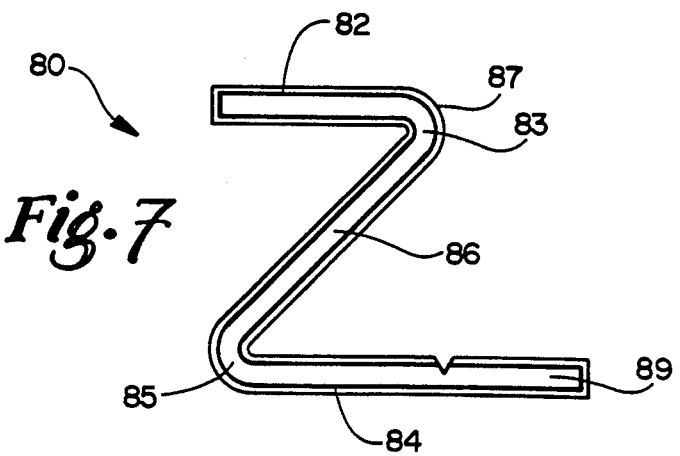

PLATED COMPLIANT LEAD

This is a continuation of application Ser. No. 07/767,500, filed Sep. 30, 1991.

INCORPORATION BY REFERENCE

The following patent is hereby fully incorporated by reference:

The Pai et al U.S. Pat. No. 4,827,611 filed Mar. 28, 1988, issued May 9, 1989, and having the same assignee as the present application.

BACKGROUND OF THE INVENTION

The present invention relates to connectors for mounting integrated circuit packages to circuit boards. More particularly, the present invention relates to a micro-miniature resilient support for supporting an integrated circuit chip or multiple-chip module (MCM) on a circuit board, and for interconnecting electrical circuits on a chip or multiple-chip module with circuits on the circuit board.

In the past, leadless ceramic chip carriers (LCCCs) exhibited problems when exposed to harsh thermally cyclic environments and vibration. Due to the thermal cycles and vibration, the solder joints which connected the LCCC to a circuit board degraded and cracked over time. The degradation and cracking was caused by stresses and strains which are induced at the solder joint by temperature cycling. Ultimately, the solder joints failed both mechanically and electrically causing failures in the electronic system in which they were used.

As a result, a compliant electrical interface between the leadless chip carrier and the circuit board, suitable for mass production using current surface mount technology, has been developed. Such an interface is described in greater detail in the Pai et al U.S. Pat. No. 4,827,611 which is hereby fully incorporated by reference. The curved leads described in the Pai et al patent serve as an electrically conductive path between the LCCC and the circuit board. The curved leads also form a mechanically compliant interface that withstands the damaging thermal stresses and vibration which degraded and destroyed solder joints in previous interfaces.

Although the compliant interface described in the Pai et al patent provides an effective interface between the LCCC and the circuit board, it is subject to certain problems. The curved leads in the Pai et al patent include tangs which carry a solder slug or bead. During a soldering process, heat is applied to the solder of the solder slug causing the solder to flow to form the solder connection between the lead and the LCCC. The flowing solder tends to run down the curved lead into the bent portions of the lead. Then, when the heat is removed and the solder cools, it hardens within the bent portions of the curved lead. This hardened solder reduces compliancy of the curved lead thereby making the interface formed by the lead less effective.

A second problem with the solder slug used on the leads in the Pai et al patent is their cost. Forming the tangs and placing the solder slug within the tangs on the curved leads is a costly assembly step.

Another problem is that if too much solder is included in the solder slug, the solder runs beyond the area intended as a solder joint. This excess solder creates adverse signal characteristics and, in severe cases, short circuits with adjacent leads or traces on the circuit board. Consequently, the circuit board must be carefully cleaned after solder connection. This is a difficult and expensive process.

In addition, the tangs and solder slugs at the end of the curved leads were relatively large in comparison to the lead width. Hence, additional space was required between adjacent leads limiting lead density.

Another problem resulted from a two step assembly process used to mount the LCCCs to a circuit board. The leads would be soldered first to the LCCC and then to the circuit board. Alignment problems resulted during the second soldering step of soldering the leads to the circuit board.

In the past, it was also widely thought that merely solder plating the leads would be ineffective in providing adequate solder joints in such applications. It was thought that gravitational forces would pull the molten solder, which had been plated on the lead, away from the solder joint during soldering thereby providing insufficient solder to form the required joint. Thus, the tangs and solder beads of the prior art tended to be the trend in manufacturing such devices.

SUMMARY OF THE INVENTION

The present invention provides mechanical and electrical connection between a board contact on a circuit board and a chip contact associated with a circuit chip or the I/O contacts on multiple-chip substrates and corresponding contacts on a printed wiring "mother" board. A curved lead is substantially entirely plated with solder and is formed of a single piece of conductive material. The curved lead has a first surface for connection to the chip contact and a second surface for connection to the board contact. The first and second surfaces are connected by at least one curved portion and are arranged to mount the circuit chip to the circuit board with the solder. The resulting connection is a compliant connection which mounts the circuit chip generally parallel to the surface of the circuit board to which it is being connected in an arrangement substantially free of stress.

It has been found that the solder plated curved leads of the present invention solve many of the problems associated with prior curved leads that included a solder slug. For example, by placing a surface of the curved lead adjacent to a board contact on a circuit board or a chip contact on a chip, and then causing the solder to flow, the surface tension of the solder enhances a capillary action which draws solder to the location of the desired solder connection. This capillary action overcomes gravitational forces which were previously thought to prohibit adequate solder joint formation with plated curved leads.

In addition, the curved leads of the present invention are plated with adequate solder to form a high quality solder joint but not so much solder that it runs away from the desired solder joint. Hence, problems associated with solder bridges, short circuits and signal quality degradation resulting from excess solder are all significantly reduced.

Also, the leads of the present invention can be soldered to both the LCCC and the circuit board simultaneously. This results in a self-aligning joint substantially free of stress.

Finally, the curved leads of the present invention are formed and then plated. This saves the assembly step of applying the solder slugs to the tangs on leads of the prior art. This also results in a uniform plating on the lead. Thus, the solder plated curved leads of the present invention are less expensive to manufacture than the curved leads of the prior art.

BRIEF DESCRIPTION OF THE DRAWINGS

FIG. 5A illustrates the manner in which a chip carrier is mounted on a circuit board using a plurality of curved leads of the present invention.

FIG. 5B illustrates the manner in which a multiple chip module (MCM) is mounted on a circuit board using a plurality of curved leads of the present invention.

FIG. 6 shows a second embodiment of a curved lead of the present invention.

FIG. 7 shows a third embodiment of a curved lead of the present invention.

DETAILED DESCRIPTION OF THE PREFERRED EMBODIMENTS

Figure 1:
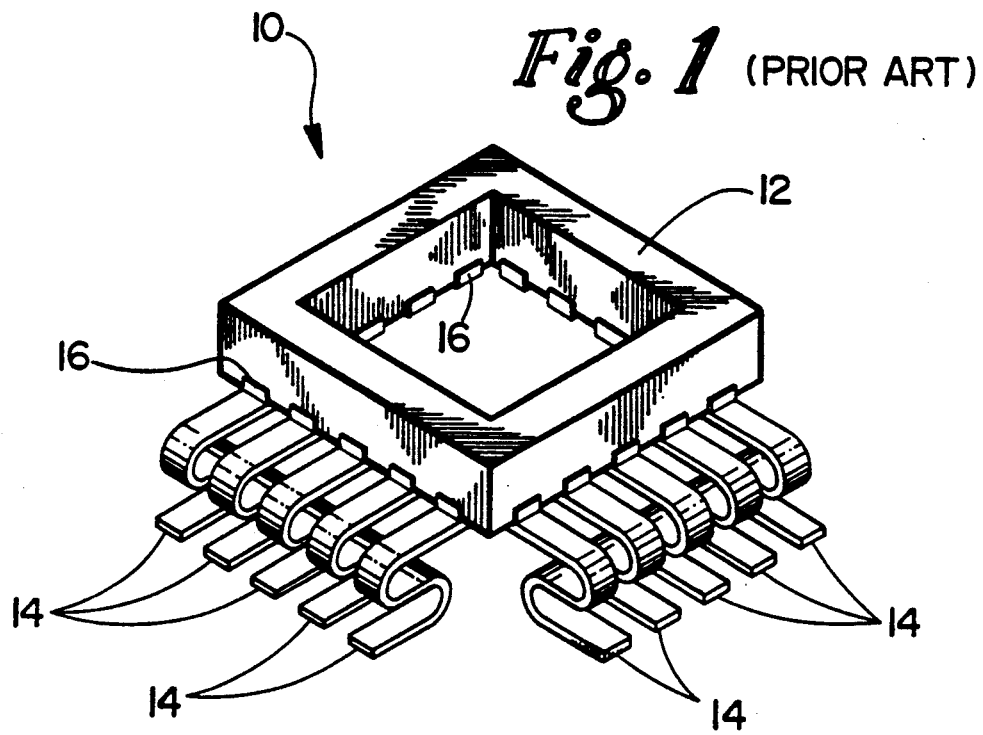
FIG. 1 is a perspective view of a chip carrier connected to curved leads of the prior art.

FIG. 1 shows a connector system 10 of the prior art. Connector system 10 includes a leadless chip carrier 12 and a plurality of curved leads 14. The curved leads 14 are shown connected to circuit contacts 16 formed on leadless chip carrier 12. The curved leads 14 are formed in accordance with the process described in the Pai et al U.S. Pat. No. 4,827,611. Thus, the curved leads provide a compliant mechanical and electrical contact between an integrated circuit chip (shown in FIG. 2) inserted in chip carrier 12 and a Circuit board.

Figure 2:
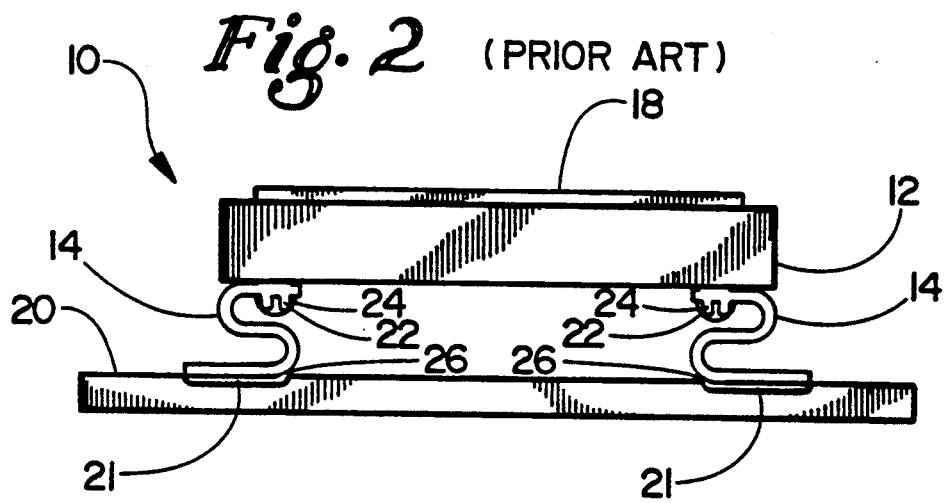
FIG. 2 illustrates the manner in which a chip carrier is mounted on a circuit board using a plurality of curved leads of the prior art.

FIG. 2 is a side view of connector system 10 showing chip carrier 12, having an integrated circuit chip 18 inserted within chip carrier 12. Chip carrier 12 is coupled to a circuit board 20. As described in the Pai et al patent, tangs 22 of curved leads 14 hold a solder bead or slug 24. Curved leads 14 are soldered to chip carrier 12 by heating the solder beads 24 causing them to wet and connect with the electrical contacts 16 of the leadless chip carrier 12. The chip carrier 12 self-centers on the leads 14. Thus, the flat chip carrier 12 makes an intimate mechanical and electrical contact with the upper surfaces of leads 14.

After leads 14 are attached to the leadless chip carrier 12, a second operation is necessary to attach the leadless chip carrier 12, through the compliant leads 14, to the circuit board 20. The circuit board 20 has metal plated electrical connections 21. The circuit board 20 mounting pads are coated with solder and the solder wets to the board 20 forming areas for mounting the carrier 12. The carrier, with leads 14, is then placed over the contacts on circuit board 20. Carrier 12 maintains the lower portion of leads 14 in alignment to match a preset pattern or footprint of circuit board contacts 21 on circuit board 20. Standard surface mount techniques are used to make the solder connection between the lower portions of leads 14 and the board contacts 21 on circuit board 20. Thus, solder joints 26 are formed between leads 14 and the contacts 21 on circuit board 20. Hence, a mechanical and electrical connection is formed between contacts 16 on carrier 12 and contacts 21 on circuit board 20.

Figure 3:
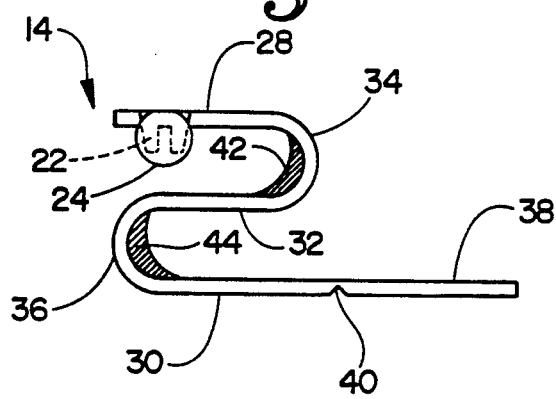
FIG. 3 illustrates an embodiment of a single curved lead of the prior art attached to a support strip.

FIG. 3 shows an enlarged side view of a lead 14 of the prior art. Lead 14 includes upper portion 28, for connection to a contact 16 on carrier 12 and lower portion 30 for connection to circuit board 20. The leads 14 of the prior art are S-shaped. Therefore, they have a central portion 32 which is coupled to upper portion 28 by curved portion 34. Central portion 32 is coupled to lower portion 30 by curved portion 36. Lead 14 is also supported by a support strip 38. However, lead 14 has an optional score 40 so that it can be easily separated from support strip 38.

Lead 14 of the prior art, shown in FIG. 3, has solder bead 24 coupled to tangs 22. Tangs 22 are integrally formed with lead 14 and protrude into solder bead 24.

When lead 14 underwent soldering, and solder of bead 24 began to flow, a number of undesirable effects occurred. First, the large amount of solder required in solder bead 24 in order to form a solid solder joint with carrier 12 was affected by gravitational forces. Thus, as solder bead 24 flowed, it moved, through the effects of surface tension and gravity, along lead 14 and settled in the inner surfaces of curved portions 34 and 36. This is indicated by cross hatched areas 42 and 44. As the solder in areas 42 and 44 cooled, it solidified. The solidified solder was rigidly attached to lead 14 and therefore decreased the compliance of lead 14. In addition, the solder from bead 24 ran beyond the area of the designated solder joint creating adverse signal characteristics and, in severe cases, short circuits and solder bridges. Consequently, circuit boards using leads 14 of the prior art had to be carefully cleaned after soldering. This cleaning process is a very difficult and expensive process.

Further, the size of solder bead 24 was relatively large compared to lead 14. Therefore, when a plurality of leads were formed, they had to be spaced to accommodate the size of solder beads 24. This adversely affected lead density.

Figure 4A:
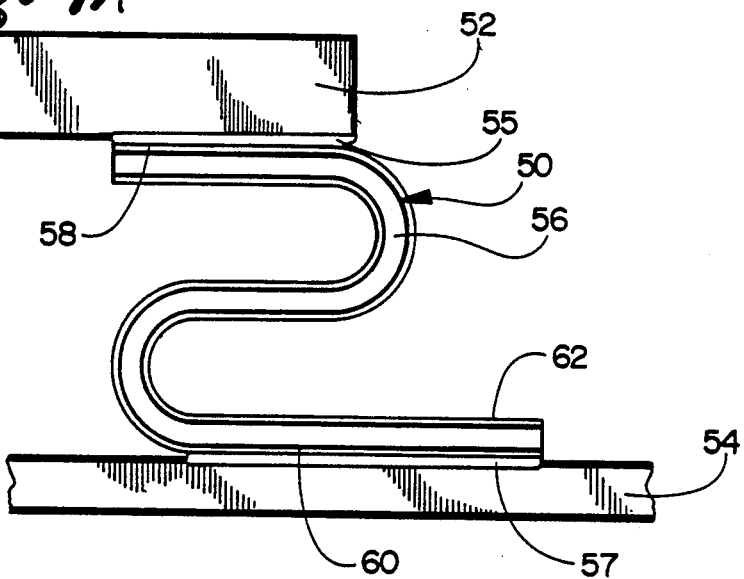
FIG. 4A illustrates an embodiment of a single curved lead of the present invention arranged between a chip carrier and a circuit board.

FIG. 4A shows a cross-sectional view of one embodiment of curved lead 50 of the present invention located between a portion of a leadless chip carrier 52 and a portion of a circuit board 54. Lead 50 is formed into the S-shape in a similar manner to lead 14 of the prior art. That formation process is described in greater detail in the Pai et al U.S. Pat. No. 4,827,611. Therefore, lead 50 is formed of a single piece of conductive material 56 having an upper surface 58 for connection to chip contact 55 on chip carrier 52 and a lower surface 60 for connection to board contact 57 on circuit board 54. However, lead 50 does not have either the depending tangs 22 or a solder bead 24 as did the prior art leads. Rather, lead 50 is entirely plated with solder plating 62.

Figure 4B:
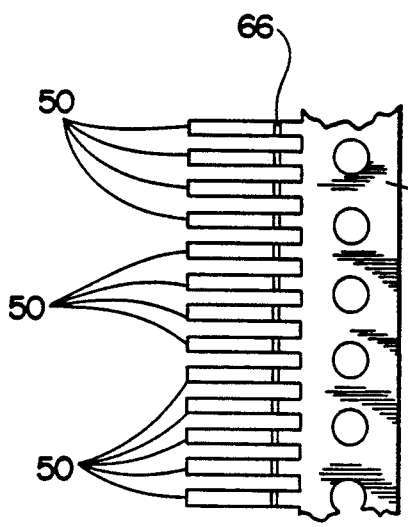
FIG. 4B shows a plurality of curved leads of the present invention formed on a support strip.

In order to connect carrier 52 to circuit board 54, a preferred assembly process is used. First, the leads are formed as shown in FIG. 4B coupled to a support strip 64. Each lead has a score 66, which is optional, to provide easy separation of the lead from the support strip 64. A plurality of leads are aligned, using the support strip 64, with chip contacts 55 on chip carrier 52. It should also be noted that where no support strip 64 is used, the leads can be aligned with chip contacts 55 using a suitable tool. Once the leads are aligned with chip contacts 55, flux is used to temporarily connect the plurality of leads 50 to the chip contacts 55. At this point, the solder may also be flowed to provide a more substantial contact between the leads 50 and the chip contacts 55. The support strip 64 is then removed from the plurality of leads 50. Next, chip carrier 52, with connected leads 50, is placed on circuit board 54 in alignment with a predetermined foot print of board contacts 57 on circuit board 54. Finally, the chip carrier 52, along with the plurality of leads 50 and the circuit board 54, are put through a soldering process.

The leads 50 are preferably formed on support strip 64 on 15-50 mil centers. Leads 50 are microminiature leads. For example, leads 50 may be 0.018 inches wide and have 0.025 inches between leads 50. Leads 50 may be 0.070 inches in height and have an overall length of 0.070 inches as well. Conductive material 56 is preferably 0.003 to 0.005 inch thick copper beryllium and cobalt alloy with high thermal conductivity.

In this preferred embodiment, a vapor phase soldering machine is used. As the solder plating 62 is heated in the vapor phase soldering machine, it liquifies or flows. The placement of surfaces 58 and 60 of lead 50 adjacent chip contacts 55 on chip carrier 52 and board contacts 57 on circuit board 54, respectively, and the effect of the surface tension of liquified solder plating 62, results in a desirable capillary effect. The capillary effect occurs due to the small dimension of the leads and the surface tension of the solder. The capillary effect essentially draws liquified solder plating 62 from other portions of lead 50 into the junction between chip contact 55 and surface 58, and into the junction between contact board 57 and surface 60. It has been observed that this capillary effect is strong enough to counteract the gravitational forces which previously caused the problems illustrated in the prior art leads described with reference to FIGS. 1-3. Thus, plated lead 50 provides a more compliant connection between chip carrier 52 and circuit board 54 due to the absence of excess solder 42 and 44.

The more compliant connection is less likely to cause undesirable signal characteristics due to the uncontrolled running of solder away from the solder junction areas. It is also less likely to be plagued by the problem of short circuits or solder bridges since the capillary effect induced at the solder junctions essentially draws solder into the solder junction area. Also, the more compliant connection improves strain relief provided by the connection. In addition, the lead spacing along support strip 64, as well as chip carrier 52, can be increased over the leads of the prior art since there is no need to provide clearance for tangs 22 and solder bead 24. Thus, lead density may be increased.

FIG. 5A illustrates the compliant connection formed by leads 50 between a chip carrier 52, with an integrated circuit chip 68 inserted between chip carrier 52, and circuit board 54. During the vapor phase soldering process, the solder at the junctions 51 between chip carrier 52 and lead 50, as well as the solder at the junctions 53 between circuit board 54 and lead 50 are both in the liquid state. Thus, both chip carrier 52 and lead 50 are said to be floating during the soldering process. Due to the surface tension of the solder at the solder junctions 51, both the leads 50 and the chip carrier 52 self-center themselves at the solder junction 51. In other words, the surface tension of the solder draws each lead 50 into alignment with its associated contact 55 on chip carrier 52. The same self-centering action takes place at junctions 53 between the board contacts 57 on circuit board 54 and the leads 50. Since both leads 50 and chip carrier 52 are floating and self-center themselves during the soldering process, centering and alignment on circuit board 54 are improved.

FIG. 5B illustrates the compliant connection formed by leads 50 between a multiple-chip module (MCM) 90, with integrated circuit chips 92 and 94 mounted on MCM 90, and circuit board 54. A multiple-chip module is a cost effective packaging technology which integrates a high input/output count with complex integrated circuits and associated passive devices in close proximity on a dense interconnect substrate. An MCM may typically be capable of operating speeds up to the gigahertz range using several relatively diverse approaches to provide a system level capability. MCM 90 is typically a ceramic substrate which has metalized circuit contacts electrically connected to chips 92 and 94. MCM 90 could also be an organic laminate. MCM 90 is mounted to circuit board 54 with leads 50 of the present invention. The same self-centering action between chip carrier 52 and leads 50 described with reference to FIG. 5A also occurs with MCM 90. In other words, the surface tension of the solder causes MCM 90 and leads 50 to self-center relative to the solder joints between leads 50 and contacts on MCM 90. In addition, self-centering also occurs at the solder joints between leads 50 and the circuit contacts on circuit board 54.

Chips 92 and 94 can be connected to MCM 90 by any suitable means including wire bonding or soldering. If chips 92 and 94 are soldered to MCM 90, MCM 90 is preferably connected, via leads 50, to circuit board 54 in a particular manner. First, chips 92 and 94 are soldered to MCM 90. Then, leads 50 are connected to MCM 90 by reflowing the solder on leads 50. The leads 50, attached to MCM 90, are placed in alignment with the mounting pads on circuit board 54. In other words, MCM 90 is positioned to rest against leads 50 which are, in turn, resting against the circuit contacts on circuit board 54. Then, the entire assembly is put through the vapor phase soldering process. The solder at the junctions between leads 50 and MCM 90, and the junctions between leads 50 and circuit board 54 flow so that the leads come into alignment with the circuit contacts on MCM 90 and the board contacts on circuit board 54. This has proven to be a cost effective manner in attaching chips to board 54.

FIG. 6 shows a second embodiment of the curved lead of the present invention. Lead 70 includes a single piece of conductive material having a first portion 72 for connection to the chip carrier. Lead 70 also includes a second portion 74 for connection to the circuit board. Portions 72 and 74 are coupled by a curved portion 76. Thus, lead 70 is a generally C-curved shaped lead and has a lower profile than the S-shaped lead 50. As with lead 50, lead 70 is solder plated with adequate solder plating 77 to form solder joints with a chip carrier and a circuit board. Lead 70 is also coupled to a support strip 79 and optionally scored for ease of disconnection from strip 79.

FIG. 7 shows a third embodiment of a lead of the present invention. Lead 80 is formed of a single piece of conductive material having a first leg 82 for connection to a leadless chip carrier and a second leg 84 for connection to a circuit board. Legs 82 and 84 are connected by a generally diagonal portion 86 and two curved portions 83 and 85. Thus, lead 80 is a generally Z-shaped lead. As with leads 50 and 70, lead 80 is solder plated with solder plating 87. Lead 80 is also coupled to a support strip 89 and optionally scored for ease of disconnection from strip 89.

It is essential that the plated leads 50, 70 and 80 of the present invention have adequate solder plating to form reliable solder joints. For example, 0.3 mils of solder plating is an inadequate amount of solder to form a reliable joint for 50 mil components. A range of solder plating having a thickness of 0.3 mils to 1.5 mils is preferred depending on the pitch (i.e., 15 mil–50 mil). It has been observed that 1.0 to 1.1 mil solder plating on the plated leads of the present invention provides excellent solder joint formation for 50 mil components.

It is preferred, although not required, that the solder plating be a tin/lead solder having a eutectic mixture. One preferred mixture is 63% Sn and 37% Pb±5%.

In addition, the leads must be formed to a dimension which allows adequate clearance for the solder plating. In other words, by example, for a 50 mil standard spacing, the leads of the present invention are preferably formed with an 18 mil thickness dimension. The 1 mil solder plating is then added.

Also, it is preferred that the single piece of conductive material used to form the leads of the present invention be formed to its final shape before being plated. For example, it is preferred that conductive portion 56 of lead 50 be formed in an S-shape before it is plated with solder plating 62. The reason for forming the conductive material prior to plating is that, if conductive portion 56 were plated first and then formed, cracks in the solder plating would tend to form in the curved portions of the lead. These cracks can cause solderability problems and solder joint formation problems. However, when the conductive portions are formed to substantially their final shape, and then plated, the solder plating is essentially uniform along the entire surface of the conductive portion 56 of the lead.

The plated leads of the present invention provide substantial advantages over leads of the prior art which used solder beads. First, the cost of the leads of the present invention is low in comparison to the cost of the leads using solder beads. The beads do not need to be assembled on the leads. Thus, one entire step of assembly is eliminated. Absence of the solder beads and tangs also means that the leads of the present invention can be spaced closer together. Thus, lead density is increased. The plated leads of the present invention also take advantage of a capillary effect during the soldering process. This substantially reduces the amount of solder running away from the desired solder joints. Thus, the compliancy of the leads is maintained and the number of solder bridges and short circuits is drastically reduced. In addition, signal quality degradation caused by solder running out of the desired solder joint is drastically reduced. Finally, the plated leads of the present invention are plated after they are formed. Therefore, the plating is uniform throughout the length of the plated lead.

Although the present invention has been described with reference to preferred embodiments, workers skilled in the art will recognize that changes may be made in form and detail without departing from the spirit and scope of the invention.

What is claimed is:

1. A system for mounting at least one integrated circuit chip in spaced relation to a circuit board and for providing electrical contact between circuit contacts associated with the chip and board contacts on the circuit board, the system comprising:

a plurality of curved leads for providing a resilient connection between the board contacts and the circuit contacts, each curved lead being substantially entirely coated with solder plating in a range of 0.3 mils to 1.5 mils thick, and each curved lead being formed of a single piece of conductive material including:

a first leg having a first surface for connection to a circuit contact; and a second leg generally parallel to the first leg and joined to the first leg by at least one curved portion, the second leg having a second surface for connection to a board contact.

2. The system of claim 1, comprising:

a support strip supporting the curved leads in a predetermined spaced relation so the first surfaces of the plurality of curved leads are spaced to mate with the circuit contacts.

3. The system of claim 2 wherein the support strip is removable from the plurality of curved leads so the second surfaces of the curved leads are mountable to the board contacts.

4. The system of claim 3 wherein the curved leads are formed to mount the chip to the circuit board in a generally parallel arrangement, to provide a compliant mechanical connection between the chip and the circuit board, and to provide an electrical connection between the chip and the circuit board.

5. The system of claim 2 wherein the curved leads are supported by the support strip so that the leads have a pitch in the range of approximately 15 mils to 50 mils.

6. The system of claim 1, comprising:

a chip carrier carrying the chip wherein the circuit contacts are supported by the chip carrier.

7. The system of claim 1, comprising:

a substrate carrying the chips wherein the circuit contacts are supported by the substrate.

8. The system of claim 7 wherein the substrate carries a plurality of chips.

9. The system of claim 8 wherein the substrate is a ceramic substrate.

10. The system of claim 8 wherein the substrate is a composite substrate.

11. The system of claim 8 wherein the substrate is a metal substrate.

12. The system of claim 8 wherein the substrate is an organic laminate substrate.

13. The system of claim 1 wherein the curved leads are generally S-shaped.

14. The system of claim 1 wherein the curved leads are generally Z-shaped.

15. The system of claim 1 wherein the curved leads are generally C-shaped.

16. The system of claim 1 wherein the curved leads are sized to permit the solder of the solder plating to flow into junctions between the first surfaces and the respective circuit contacts and between the second surfaces and the respective board contacts.

17. An apparatus for providing a mechanical connection and an electrical connection between a board contact on a circuit board and a chip contact associated with a circuit chip, the apparatus comprising:

a curved lead substantially entirely plated with solder plating in a range of 0.3 mils to 1.5 mils thick and being formed of a single piece of conductive material having a first surface for connection to the chip contact and a second surface, generally parallel to the first surface, for connection to the board contact, the first and second surfaces being connected by at least one curved portion, the first and second surfaces being arranged to mount the circuit chip to the circuit board with the solder plating in a compliant, generally flat arrangement substantially free of stress.

18. The apparatus of claim 17 wherein the curved lead is substantially S-shaped.

19. The apparatus of claim 17 wherein the curved lead is substantially C-shaped.

20. The apparatus of claim 17 wherein the curved lead is substantially Z-shaped.

21. The apparatus of claim 17 wherein the curved leads are sized to permit the solder of the solder plating to flow into junctions between the first surfaces and the respective circuit contacts and between the second surfaces and the respective board contacts.

* * * * *

UNITED STATES PATENT AND TRADEMARK OFFICE
CERTIFICATE OF CORRECTION

PATENT NO. : 5,317,479
DATED : May 31, 1994
INVENTOR(S) : DEEPAK K. PAI, TERRANCE A. KRINKE

It is certified that error appears in the above-indentified patent and that said Letters Patent is hereby corrected as shown below:

On the Title page, after Attorney, Agent, or Firm, delete "Linney & Lange", insert --Kinney & Lange--

Col. 3, line 41, delete "Circuit", insert --circuit--

Col. 6, line 52, delete "C-curved shaped", insert --C-shaped--

Signed and Sealed this

Fifteenth Day of November, 1994

Attest:

BRUCE LEHMAN

*Attesting Officer*          *Commissioner of Patents and Trademarks*

UNITED STATES PATENT AND TRADEMARK OFFICE
CERTIFICATE OF CORRECTION

PATENT NO. : 5,317,479
DATED : May 31, 1994
INVENTOR(S) : DEEPAK K. PAI, TERRANCE A. KRINKE

It is certified that error appears in the above-indentified patent and that said Letters Patent is hereby corrected as shown below:

On the Title page, delete [73] Assignee: Computing Devices International, Inc., Minneapolis, Minn.

insert --[73] Assignee: Ceridian Corporation, Minneapolis, Minn.

Signed and Sealed this

Seventeenth Day of January, 1995

Attest:

BRUCE LEHMAN

*Attesting Officer*     *Commissioner of Patents and Trademarks*